(12) United States Patent
Hashimoto

(10) Patent No.: US 6,897,094 B2
(45) Date of Patent: May 24, 2005

(54) SEMICONDUCTOR DEVICE AND METHOD OF MANUFACTURING THE SAME, CIRCUIT BOARD, AND ELECTRONIC INSTRUMENT

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/365,615

(22) Filed: Feb. 12, 2003

(65) Prior Publication Data

US 2003/0168721 A1 Sep. 11, 2003

(30) Foreign Application Priority Data

Mar. 11, 2002 (JP) .................................... 2002-065234

(51) Int. Cl.⁷ .................. H01L 21/44; H01L 21/48; H01L 21/50
(52) U.S. Cl. ............... 438/118; 438/127; 438/108; 257/783; 257/787; 257/790
(58) Field of Search ................. 438/118, 127, 438/108; 257/783, 787, 778, 790

(56) References Cited

U.S. PATENT DOCUMENTS 6,429,372 B1 * 8/2002 Taguchi et al. ............ 174/52.4

FOREIGN PATENT DOCUMENTS

| JP | 63-239827 | 10/1988 |
| JP | 06-349893 | 12/1994 |
| JP | 08-236586 | 9/1996 |
| JP | 2000-176967 | 6/2000 |
| JP | 2000-311968 | 11/2000 |
| JP | 2001-223230 | 8/2001 |
| JP | 2001-326304 | 11/2001 |
| JP | 2002-026244 | 1/2002 |

* cited by examiner

Primary Examiner—Nitin Parekh
(74) Attorney, Agent, or Firm—Hogan & Hartson, LLP

(57) ABSTRACT

A semiconductor chip is adhered to a substrate by using an adhesive, and a sealant is provided around the semiconductor chip, on a surface of the substrate on which the semiconductor chip is mounted. The adhesive is provided to reach a side surface of the semiconductor chip. The sealant is provided in a manner to expose an upper surface of the semiconductor chip and a part of the adhesive.

8 Claims, 4 Drawing Sheets

SEMICONDUCTOR DEVICE AND METHOD OF MANUFACTURING THE SAME, CIRCUIT BOARD, AND ELECTRONIC INSTRUMENT

Japanese Patent Application No. 2002-65234, filed on Mar. 11, 2002, is hereby incorporated by reference in its entirety.

BACKGROUND OF THE INVENTION

The present invention relates to a semiconductor device and method of manufacturing the same, to a circuit board, and to an electronic instrument.

In a semiconductor device of the T-BGA (Tape-Ball Grid Array) format, in order to ensure planarity of external terminals (for example solder balls), a stiffener is attached to the substrate for reinforcement. To attach the stiffener, an expensive adhesive is required, and the stiffener itself is also expensive, and equipment for the attachment is also required. A resin-sealed semiconductor device is also known. According to this type of conventional semiconductor device, since the semiconductor chip is completely sealed by the mold resin, the heat dispersion is insufficient.

BRIEF SUMMARY OF THE INVENTION

A method of manufacturing a semiconductor device according to an aspect of the present invention includes:

adhering a semiconductor chip to a substrate by using an adhesive, and providing a sealant around the semiconductor chip, on a surface of the substrate on which the semiconductor chip is mounted, wherein the adhesive is provided to reach a side surface of the semiconductor chip, and wherein the sealant is provided in a manner to expose an upper surface of the semiconductor chip and a part of the adhesive.

A method of manufacturing a semiconductor device according to another aspect of the present invention includes:

adhering a semiconductor chip to a substrate, and providing a sealant around the semiconductor chip, on a surface of the substrate on which the semiconductor chip is mounted, wherein a film is disposed on the semiconductor chip adhered to the substrate, an upper die is disposed over the film, a lower die is disposed under the substrate, the semiconductor chip and the substrate are sandwiched by the upper die and lower die, the semiconductor chip is pressed into the film, and the sealant is provided between the film and the substrate.

A semiconductor device according to a further aspect of the present invention includes:

a substrate;

a semiconductor chip bonded face-down to the substrate;

an adhesive adhering the substrate to the semiconductor chip, and provided to reach a side surface of the semiconductor chip;

and a sealant provided around the semiconductor chip, on a surface of the substrate on which the semiconductor chip is mounted, wherein the sealant is provided in a manner to expose an upper surface of the semiconductor chip and a part of the adhesive.

A circuit board according to a still further aspect of the present invention has the above mentioned semiconductor device mounted on the circuit board.

An electronic instrument according to a yet further aspect of the present invention has the above mentioned semiconductor device.

DETAILED DESCRIPTION OF THE EMBODIMENT

Figure 1A:
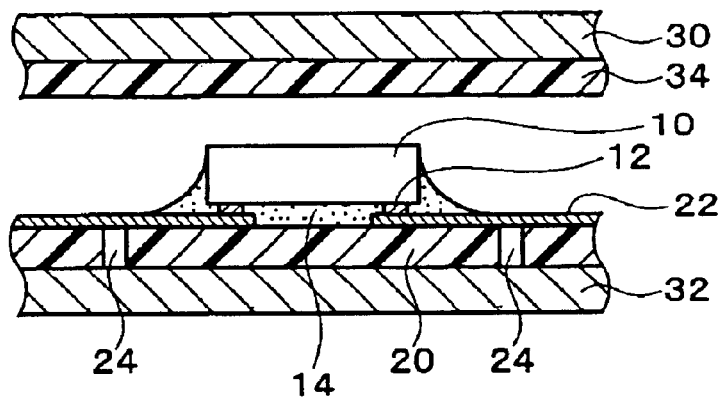
FIGS. 1A to 1C illustrate a method of manufacturing a semiconductor device according to an embodiment of the present invention.

Embodiments of the present invention may provide a semiconductor device and method of manufacturing the same, a circuit board, and an electronic instrument in which a substrate is reinforced, and heat dispersion is high.

(1) A method of manufacturing a semiconductor device according to an embodiment of the present invention includes:

adhering a semiconductor chip to a substrate by using an adhesive, and providing a sealant around the semiconductor chip, on a surface of the substrate on which the semiconductor chip is mounted, wherein the adhesive is provided to reach a side surface of the semiconductor chip, and wherein the sealant is provided in a manner to expose an upper surface of the semiconductor chip and a part of the adhesive.

According to this embodiment of the present invention, the substrate can be reinforced by the sealant. Since the upper surface of the semiconductor chip (more precisely, the surface opposite to the substrate) is exposed from the sealant, the heat dispersion is excellent. Furthermore, since the sealant is provided in a manner to expose a part of the adhesive, water vapor can escape from the adhesive.

(2) In this method of manufacturing a semiconductor device:

a film may be disposed on the semiconductor chip adhered to the substrate, an upper die may be disposed over the film, a lower die may be disposed under the substrate, the semiconductor chip and the substrate may be sandwiched by the upper die and lower die, the semiconductor chip may be pressed into the film, and the sealant may be provided between the film and the substrate.

By means of this, since the sealant is provided with the film pressed into the semiconductor chip, the sealant is lower than the semiconductor chip, water vapor can more easily escape from the interface between the sealant and the semiconductor chip. Since the semiconductor chip contacts the film without directly contacting the upper die, chipping and cracking can be prevented.

(3) In this method of manufacturing a semiconductor device:

the semiconductor chip and the substrate may be sandwiched by the upper die and lower die in such a manner that a part of the adhesive is pressed into the film.

(4) A method of manufacturing a semiconductor chip according to another embodiment of the present invention includes:

adhering a semiconductor chip to a substrate, and providing a sealant around the semiconductor chip, on a surface of the substrate on which the semiconductor chip is mounted, wherein a film is disposed on the semiconductor chip adhered to the substrate, an upper die is disposed over the film, a lower die is disposed under the substrate, the semiconductor chip and the substrate are sandwiched by the upper die and lower die, the semiconductor chip is pressed into the film, and the sealant is provided between the film and the substrate.

According to the embodiment of the present invention, the substrate can be reinforced by the sealant. Since the sealant is provided with the semiconductor chip pressed into the film, the upper surface of the semiconductor chip (more precisely, the surface opposite to the substrate) is exposed from the sealant, and moreover, the sealant is lower than the semiconductor chip. As a result thereof, the heat dispersion of the semiconductor device is improved, and water vapor can more easily escape from the interface between the sealant and the semiconductor chip. Since the semiconductor chip does not directly contact the upper die film, chipping and cracking can be prevented.

(5) In this method of manufacturing a semiconductor device:

the film may be more easily peeled from the sealant than from the upper die.

(6) A semiconductor device according to a further embodiment of the present invention includes:

a substrate;

a semiconductor chip bonded face-down to the substrate;

an adhesive adhering the substrate to the semiconductor chip, and provided to reach a side surface of the semiconductor chip;

and a sealant provided around the semiconductor chip, on a surface of the substrate on which the semiconductor chip is mounted, wherein the sealant is provided in a manner to expose an upper surface of the semiconductor chip and a part of the adhesive.

According to this embodiment of the present invention, the substrate can be reinforced by the sealant. Since the upper surface of the semiconductor chip (more precisely, the surface opposite to the substrate) is exposed from the sealant, heat dispersion is excellent. Furthermore, since the sealant is provided to expose a part of the adhesive, water vapor can escape from the adhesive.

(7) A circuit board according to a still further embodiment of the present invention has the above mentioned semiconductor device mounted on the circuit board.

(8) An electronic instrument according to a yet further embodiment of the present invention has the above mentioned semiconductor device.

An embodiment of the present invention is now described with reference to the drawings. FIGS. 1A to 2C illustrate the method of manufacturing a semiconductor device of an embodiment of the present invention.

In this embodiment, a semiconductor chip 10 is adhered to a substrate 20. The semiconductor chip 10 is an integrated circuit chip. The semiconductor chip 10 has a plurality of electrodes 12. The electrodes 12 include pads and bumps formed thereon. Between these pads and bumps may be further included a metal layer of under-bump metal or the like. On the surface of the semiconductor chip 10 on which the electrodes 12 are provided, a passivation film is formed, to avoid the electrodes 12. The passivation film can be formed of, for example, $SiO_2$, SiN, polyimide resin, or the like.

The material of the substrate 20 may be either an organic or inorganic material, or may be a composite structure thereof. As a substrate formed of an organic material may be cited, for example, a flexible substrate formed of a polyimide resin. As a flexible substrate may be used an FPC (Flexible Printed Circuit), or a tape used in TAB (Tape Automated Bonding) technology. As a substrate formed of an inorganic material may be cited, for example, a ceramic substrate or glass substrate. As a composite structure of organic and inorganic materials may be cited, for example, a glass epoxy substrate. A substrate with a built-up multilayer construction having an insulating resin and an interconnecting pattern laminated, or a multilayer substrate having a plurality of substrates laminated may be used.

On the substrate 20, an interconnecting pattern 22 is formed. The interconnecting pattern 22 can be formed by laminating any of copper, chromium, titanium, nickel, titanium-tungsten, gold, aluminum, nickel-vanadium, and tungsten, or by one layer of any. The interconnecting pattern 22 may be attached to the substrate 20 with an adhesive material (not shown in the drawings) interposed, to form a three-layer substrate. In this case, after applying photolithography, etching is carried out to form the interconnecting pattern 22. Alternatively, the interconnecting pattern 22 may be formed on the substrate 20 without an adhesive, to constitute a two-layer substrate. For example, the interconnecting pattern may be formed by sputtering or the like, or an additive method of forming the interconnecting pattern 22 by plating may be applied. The interconnecting pattern 22 is preferably formed by plating with solder, tin, gold, nickel, or the like. If a metal plating is applied so as to form a eutectic, then the metal bond is more easily achieved, and this is desirable. On the interconnecting pattern 22, bumps may be formed on bonding portions for other conductive elements. A part of the interconnecting pattern 22 may be formed as lands of greater area than the portions for interconnecting lines. These lands function to ensure the presence of adequate electrical connection portions.

In the substrate 20, a through hole 24 is formed. The interconnecting pattern 22 may be formed to span the through hole 24. The interconnecting pattern 22 may be formed to cover the opening of the through hole 24. For example, the interconnecting pattern 22 may have a land which is larger than the opening of the through hole 24, and this land may cover the through hole 24. Alternatively, the interconnecting pattern 22 may have connection portions whose width is less than the diameter or width of the through hole 24, and these connection portions may pass through the through hole 24. In this case, it is arranged that a part of the opening of the through hole 24 is not covered.

The semiconductor chip 10 is bonded face-down to the substrate 20. For the electrical connection of the electrodes 12 and interconnecting pattern 22, an insulating resin bond (for example a bond using NCP (non-conductive paste), NCF (non-conductive film), or the like), an anisotropic conductive material bond (for example a bond using ACF (anisotropic conductive film) or the like), an alloy bond (for example Au—Au or Au—Sn bond or the like), a solder bond or any suchlike known bonding method may be applied.

The semiconductor chip 10 and substrate 20 may be fixed with an adhesive 14. The adhesive 14 is provided to reach the side surface of the semiconductor chip 10 (the surface upright to the surface on which the electrodes 12 are provided). It should be noted that the adhesive 14 may be provided to the same height as the upper surface (the surface opposite to that on which the electrodes 12 are provided) of the semiconductor chip 10, or may be provided to a position lower than the upper surface. The adhesive 14 may be such as to absorb moisture more easily than a sealant 36. The adhesive 14 may be NCP, NCF, or ACF.

As shown in FIG. 1A, the substrate 20, with the semiconductor chip 10 mounted thereon, is disposed on a lower die 32. The surface of the substrate 20 opposite to that on which the semiconductor chip 10 is mounted contacts the lower die 32. On the upper part of the semiconductor chip 10 (more precisely the surface of the semiconductor chip 10 opposite to that of the substrate 20), a film 34 is disposed. The film 34 is flexible. The film 34 is formed of a resin. For example, this resin may be a fluorine-based resin. On the film 34 is disposed an upper die 30. The film 34 may be adhered to the upper die 30. As the upper die 30 and lower die 32 can be used the dies of a transfer mold device.

Figure 1B:
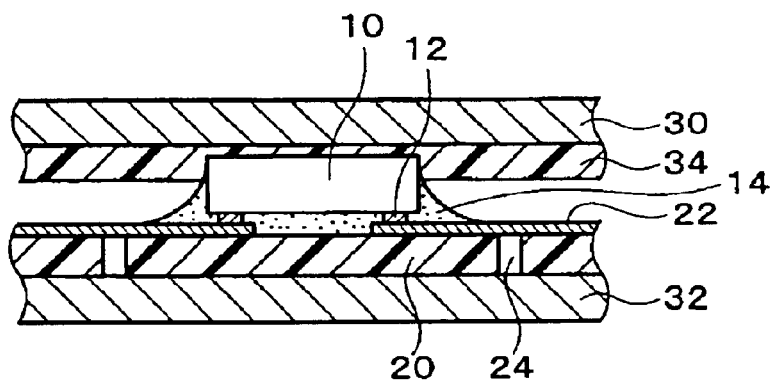

As shown in FIG. 1B, the semiconductor chip 10 and substrate 20 are sandwiched by the upper die 30 and lower die 32. Between the semiconductor chip 10 and the upper die 30 the film 34 is interposed, and the semiconductor chip 10 is pressed into the film 34. A part (the upper extremity) of the adhesive 14 (more precisely, the adhesive 14 provided on the side surface of the semiconductor chip 10) may be pressed into the film 34. By this means, the upper surface of the semiconductor chip 10 can be covered by the film 34. A part of the adhesive 14 can be covered by the film 34. Furthermore, a part of the side surface of the semiconductor chip 10 (the upper extremity of the side surface) may be covered by the film 34.

Figure 1C:
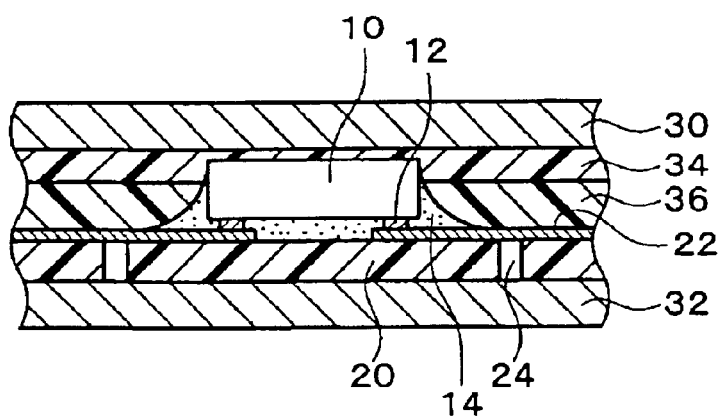

As shown in FIG. 1C, between the upper die 30 and lower die 32 the sealant (for example a transfer mold resin) 36 is provided. The sealant 36 is provided on the surface of the substrate 20 on which the semiconductor chip 10 is mounted. In more detail, the sealant 36 is provided between the film 34 and the substrate 20. Since the film 34 is pressed into the semiconductor chip 10, the sealant 36 can be provided so as not to cover the upper surface of the semiconductor chip 10. If a part of the adhesive 14 is pressed into the film 34, the sealant 36 can be provided so as not to cover a part of the adhesive 14. The sealant 36 is provided around the semiconductor chip 10.

By means of this, since the sealant 36 is provided when the film 34 is pressed into the semiconductor chip 10, the sealant 36 is lower than the semiconductor chip 10, and it is easier for water vapor to escape from the interface between the sealant 36 and the semiconductor chip 10. Therefore, when the semiconductor device is mounted on a circuit board, the resistance to reflow processes is improved. If the adhesive 14 is exposed, the water vapor can more easily escape therefrom, and the resistance to reflow processes of the semiconductor device is improved. If the semiconductor chip 10 is made thinner, it becomes simpler to make semiconductor devices thinner. Furthermore, since the semiconductor chip 10 does not directly contact the upper die 30, but contacts the film 34, chipping or cracking can be avoided.

Figure 2A:
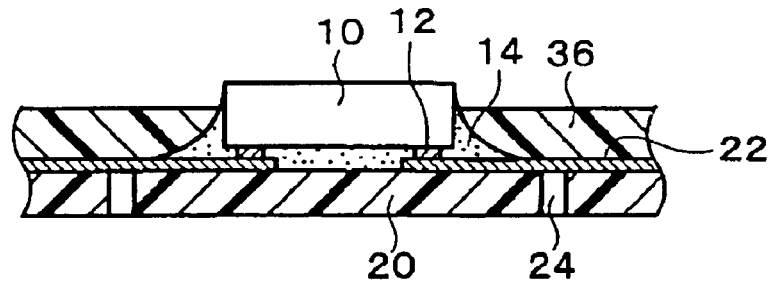
FIGS. 2A to 2C illustrate the method of manufacturing a semiconductor device of according to the embodiment of the present invention.
Figure 2B:
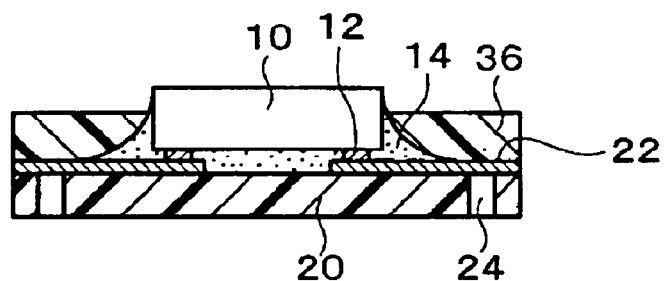
Figure 2C:
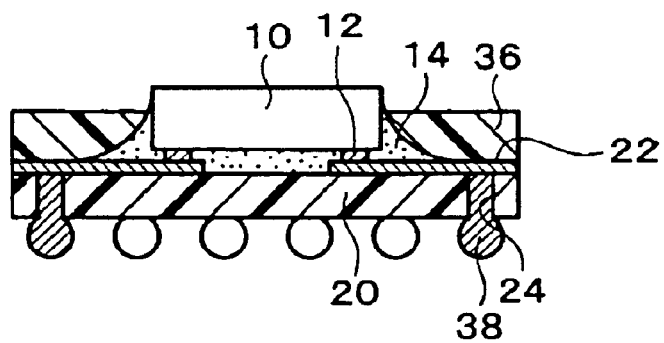

As shown in FIG. 2A, the semiconductor chip 10 is removed from the upper die 30 and lower die 32. The film 34 may be of a nature to be more easily peeled from the sealant 36 than from the upper die 30. When the film 34 is peeled from the semiconductor chip 10 and sealant 36, a part of the upper surface of the semiconductor chip 10 and adhesive 14 is exposed by the sealant 36. As shown in FIG. 2B, the substrate 20 and sealant 36 may be cut. Furthermore, as shown in FIG. 2C, if required, external terminals (for example solder balls) 38 are provided. The external terminals 38, achieving for example electrical connection through the through hole 24, may be provided on the interconnecting pattern 22. In this way, the semiconductor device can be manufactured.

The semiconductor device of this embodiment includes the substrate 20 and the semiconductor chip 10 bonded face-down to the substrate 20. The substrate 20 and semiconductor chip 10 are adhered by the adhesive 14. The adhesive 14 is provided to reach the side surface of the semiconductor chip 10. On the surface of the substrate 20 on which the semiconductor chip 10 is mounted, the sealant 36 is provided around the semiconductor chip 10. The sealant 36 is provided to expose the upper surface of the semiconductor chip 10 and a part of the adhesive 14.

According to the semiconductor device of this embodiment, the substrate 20 is reinforced by the sealant 36, and the coplanarity of the external terminals 38 can be assured. This sealant 36 has the advantage of being less expensive than a metal stiffener. Since the upper surface of the semiconductor chip 10 (more precisely, the surface opposite to that of the substrate 20) is exposed by the sealant 36, the heat dispersion is excellent. Furthermore, since the sealant 36 can be provided so as to expose a part of the adhesive 14, water vapor can be allowed to escape from the adhesive 14.

Figure 3:
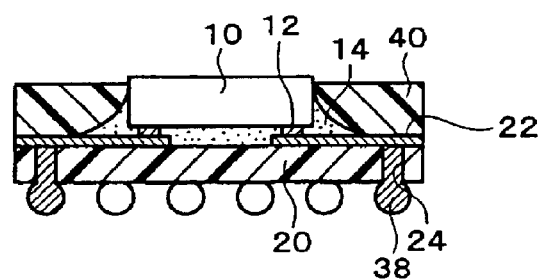
FIG. 3 illustrates a modification of the method of manufacturing a semiconductor device of the embodiment of the present invention.

In the above described method of manufacturing the semiconductor device, the sealant 36 is provided to expose a part of the adhesive 14, but the method of manufacturing a semiconductor device of the present invention does not exclude the case in which, as shown in FIG. 3, a sealant 40 is provided to cover the whole of the adhesive 14.

Figure 4:
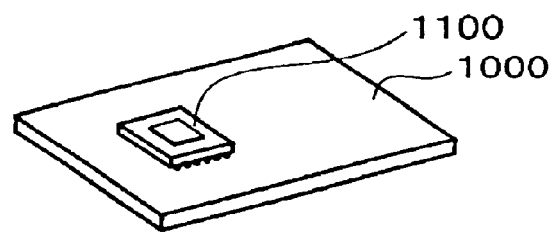
FIG. 4 shows a circuit board according to an embodiment of the present invention.
Figure 5:
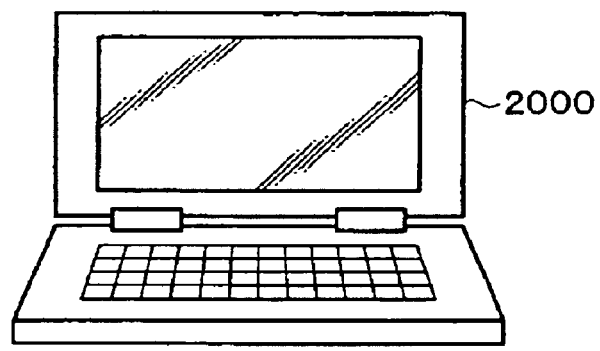
FIG. 5 shows an electronic instrument according to an embodiment of the present invention.
Figure 6:
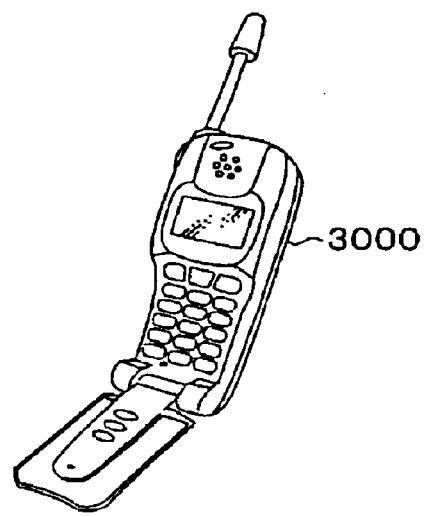
FIG. 6 shows an electronic instrument according to an embodiment of the present invention.

FIG. 4 shows a circuit board 1000 on which is mounted the semiconductor device 1100 shown in FIG. 2C. As electronic instruments having the semiconductor device shown in FIG. 2C, in FIG. 5 a notebook personal computer 2000 is shown, and in FIG. 6 a portable telephone 3000 is shown.

The present invention is not restricted to the above described embodiments, and various modifications are possible. For example, the present invention includes substantially the same construction as the construction described in the embodiment (for example, a construction for which the function, method, and result are the same, or a construction of which the purpose and result are the same). The present invention includes a construction in which parts which are not of the essence of the construction described in the embodiment are replaced. The present invention includes a construction having the same effect as the construction described in the embodiment or a construction capable of achieving the same purpose. The present invention includes a construction having the construction described in the embodiment to which is added well-known art.

What is claimed is:

1. A method of manufacturing a semiconductor device comprising:

adhering a semiconductor chip to a substrate by using an adhesive, and providing a sealant around the semiconductor chip, on a surface of the substrate on which the semiconductor chip is mounted, wherein the adhesive is provided to reach a side surface of the semiconductor chip, and wherein the sealant is provided in a manner to expose an upper surface of the semiconductor chip and a part of the adhesive, and wherein a film is disposed on the semiconductor chip adhered to the substrate, an upper die is disposed over the film, a lower die is disposed under the substrate, the semiconductor chip and the substrate are sandwiched by the upper die and lower die, the semiconductor chip is pressed into the film, and the sealant is provided between the film and the substrate.

2. The method of manufacturing a semiconductor device as defined by claim 1, wherein the semiconductor chip and the substrate are sandwiched by the upper die and lower die in such a manner that a part of the adhesive is pressed into the film.

3. The method of manufacturing a semiconductor device as defined by claim 2, wherein the film is more easily peeled from the sealant than from the upper die.

4. The method of manufacturing a semiconductor device as defined by claim 1, wherein the film is more easily peeled from the sealant than from the upper die.

5. A method of manufacturing a semiconductor device comprising, adhering a semiconductor chip to a substrate, and providing a sealant around the semiconductor chip, on a surface of the substrate on which the semiconductor chip is mounted, wherein a film is disposed on the semiconductor chip adhered to the substrate, an upper die is disposed over the film, a lower die is disposed under the substrate, the semiconductor chip and the substrate are sandwiched by the upper die and lower die, the semiconductor chip is pressed into the film, and the sealant is provided between the film and the substrate.

6. The method of manufacturing a semiconductor device as defined by claim 5, wherein the film is more easily peeled from the sealant than from the upper die.

7. The method of manufacturing a semiconductor device as defined by claim 5, wherein the semiconductor chip is adhered to the substrate with an adhesive, a part of the adhesive positioned next to a side surface of the semiconductor chip, wherein the semiconductor chip is pressed into the film so that the film touches the part of the adhesive next to the side surface of the semiconductor chip.

8. A method of manufacturing a semiconductor device comprising;

adhering semiconductor chip to a substrate by using an adhesive, and providing a sealant around the semiconductor chip, on a surface of the substrate which the semiconductor chin is mounted, wherein the adhesive is provided to reach a side surface of the semiconductor chip, and wherein the sealant is provided in a manner to expose an upper surface of the semiconductor chip and a part of the adhesive, and wherein the adhesive consists of its first, second and third parts, the first part positioned under the semiconductor chip, the second part positioned around the semiconductor chip and covered with the sealant, the third part positioned next to the side surface of the semiconductor chip and exposed from the sealant.

* * * * *